(12) United States Patent
Lee (10) Patent No.: US 7,277,286 B2
(45) Date of Patent: Oct. 2, 2007

(54) COMPUTERS

(75) Inventor: Sang Cheol Lee, Kyungki-do (KR)

(73) Assignee: Zalman Tech Co., Ltd.

( * ) Notice: Subject to any disclaimer, the term of this patent is extended or adjusted under 35 U.S.C. 154(b) by 8 days.

(21) Appl. No.: 11/229,187

(22) Filed: Sep. 16, 2005

(65) Prior Publication Data

US 2006/0056155 A1 Mar. 16, 2006

(30) Foreign Application Priority Data

Sep. 16, 2004 (KR) ...................... 10-2004-0074220

(51) Int. Cl.
*H05K 7/20* (2006.01)
(52) U.S. Cl. ...................... 361/700; 361/688; 361/689; 361/690; 361/714; 361/719; 361/721; 174/15.2; 174/16.1; 174/16.3
(58) Field of Classification Search ................ 361/718, 361/700, 679, 688, 699, 704, 711, 715; 165/104.33, 165/80.3; 174/252
See application file for complete search history.

(56) References Cited

U.S. PATENT DOCUMENTS

| | | | | |
|---|---|---|---|---|
| 5,243,493 A | * | 9/1993 | Jeng et al. .................. | 361/690 |
| 5,323,847 A | * | 6/1994 | Koizumi et al. ........ | 165/104.33 |
| 6,101,090 A | * | 8/2000 | Gates .......................... | 361/690 |
| 6,288,893 B1 | * | 9/2001 | Faranda et al. ............. | 361/683 |
| 6,320,746 B2 | * | 11/2001 | Pei et al. ..................... | 361/695 |
| 6,418,018 B1 | * | 7/2002 | Lo .............................. | 361/700 |
| 6,585,039 B2 | * | 7/2003 | Sagal et al. ................. | 165/185 |
| 6,747,869 B2 | * | 6/2004 | Dong .......................... | 361/687 |
| 6,778,394 B2 | * | 8/2004 | Oikawa et al. ............. | 361/700 |
| 2002/0041484 A1 | * | 4/2002 | Lajara et al. ............... | 361/687 |
| 2004/0231827 A1 | * | 11/2004 | Fu et al. ..................... | 165/80.3 |
| 2005/0265003 A1 | * | 12/2005 | Coglitore et al. ........... | 361/724 |

* cited by examiner

*Primary Examiner*—Boris Chérvinsky
(74) *Attorney, Agent, or Firm*—Tuchman & Park LLC (57) ABSTRACT

Provided is a computer. The computer includes: a plurality of parts including heat-generating components that generate heat during operation; a case in which the parts are installed; and one or more heat-dissipating plates separated from the case by a predetermined distance and facing the case; wherein the heat-generating components include a central processing unit and a power supply, and the central processing unit and the power supply are each thermally connected to the heat-dissipating plates so that heat generated by the central processing unit and the power supply can be dissipated to the outside of the case via the heat-dissipating plates. Accordingly, the heat-generating components installed in the case can be noiselessly and efficiently cooled without using cooling fans.

8 Claims, 9 Drawing Sheets

COMPUTERS

CROSS-REFERENCE TO RELATED PATENT APPLICATION

This application claims the benefit of Korean Patent Application No. 10-2004-0074220, filed on Sep. 16, 2004, in the Korean Intellectual Property Office, the disclosure of which is incorporated herein in its entirety by reference.

BACKGROUND OF THE INVENTION

1. Field of the Invention

The present invention relates to a computer, and more particularly, to a computer capable of efficiently and noiselessly dissipating heat generated by heat-generating components installed in a case without using cooling fans.

2. Description of the Related Art

In general, computers are comprised of a variety of functional parts. Representative examples of functional parts that may be installed in a computer case include a main board, a central processing unit (CPU), a graphics card, a sound card, a power supply, a hard disk drive, a floppy disk drive, a compact disk-read only memory (CD-ROM) drive, and a digital versatile disk-read only memory (DVD-ROM) drive. These internal parts installed in the computer case are connected to external peripheral devices, such as a monitor, a mouse, a keyboard, an external memory device, and a printer.

Among such internal parts mounted in the computer case, the CPU, the power supply, and the graphics card are known as typical heat-generating components. When the temperature of a heat-generating component is elevated due to heat generated in the component, the performance of the internal parts is degraded and, in the worst case, the component may not function at all. As higher performing computer systems appear, the amount of heat generated by the heat-generating components increases, raising the need for better cooling. This is one of the critical issues that the computer industry is facing.

A general method of cooling heat-generating components installed in a computer case involves bringing heat absorbing heatsinks into contact with the heat-generating components and blowing cooling air over the heatsinks using cooling fans. Various research, for example, research regarding the types of materials and shapes of such a heatsink, has been conducted to efficiently absorb or dissipate heat generated by the heat-generating components.

In conventional computer cooling systems developed to date, commonly, each heat-generating component installed in a computer case is cooled by a cooling fan attached to the same, and the air that is heated in the computer case is outwardly discharged by another cooling fan attached to the body of the computer case. However, such conventional computer cooling systems have the following problems.

Since a number of cooling fans, which rotate at a high speed, are installed to cool the heat generating sources installed in the computer case, a large amount of noise is generated during the operation of the computer system. In fact, most of the noise generated by a computer system is mechanical noise caused by the cooling fans. Such noise generated by the cooling fans generally bothers computer users, particularly, sensitive users, and lowers working efficiency. Another problem is that external dust particles stick to the parts in the computer case, since a large volume of external air is circulated through the computer case by the cooling fans during the operation of the computer system. This problem becomes worst due to the electrostatic force generated by the internal parts and finally may lead to operational failure of the parts.

Another problem with the conventional computer cooling system lies in the inefficiency due to the active cooling of the heat-generating components within the computer case. The internal temperature of the computer system delimited by the computer case rises in a short time to be higher than the external temperature when the computer system is operated. Thus, the heat-generating components cannot be effectively cooled using the warm air in the computer case.

SUMMARY OF THE INVENTION

The present invention provides a computer with an efficient cooling system that can efficiently cool heat-generating components installed in a computer case without generating noise.

According to an aspect of the present invention, there is provided a computer comprising: a plurality of parts including heat-generating components that generate heat during operation; a case in which the parts are installed; and one or more heat-dissipating plates separated from the case by a predetermined distance and facing the case; wherein the heat-generating components include a central processing unit and a power supply, and the central processing unit and the power supply are each thermally connected to the heat-dissipating plates so that heat generated by the central processing unit and the power supply can be dissipated to the outside of the case via the heat-dissipating plates.

The computer may further comprise heatpipes passing through the case, the heatpipes having first ends connected to the central processing unit and second ends connected to the heat-dissipating plates, wherein the central processing unit is thermally connected to the heat-dissipating plates via the heatpipes.

A portion of the power supply may extend beyond the case to be exposed to the outside of the case and a surface of the exposed portion of the power supply may contact the heat-dissipating plates, such that the power supply is thermally connected to the heat-dissipating plates.

The power supply may have through-holes formed in an upper surface and a lower surface, such that external air can flow into the power supply through the through-hole formed in the lower surface of the power supply and then can be discharged through the through-hole formed in the upper surface of the power supply.

The heat-generating components may include a graphics card, the computer further comprising a heat conduction unit passing through the case and having a first end connected to the graphics card and a second end connected to the heat-dissipating plates to discharge heat generated by the graphics card to the outside of the case via the heat-dissipating plates, wherein the graphics card is thermally connected to the heat-dissipating plates via the heat conduction unit.

Each of the heat-dissipating plates may be made of aluminum and have a plurality of heat-dissipating fins protruding therefrom.

The heat-dissipating plates may include a plurality of parallel heat-dissipating plate members that are separated from one another.

The case may include a plurality of plates, wherein among the plates, an upper plate forming a top surface of the case is pivotably coupled to other plates to open and close the case.

The computer may further comprise a leg member that enables a bottom surface of the case to be separated from the floor on which the case stands.

BRIEF DESCRIPTION OF DRAWINGS

The above and other features and advantages of the present invention will become more apparent by describing in detail exemplary embodiments thereof with reference to the attached drawings in which.

DETAILED DESCRIPTION OF PREFERRED EMBODIMENTS

The present invention will now be described more fully with reference to the accompanying drawings, in which preferred embodiments of the invention are shown.

Figure 1:
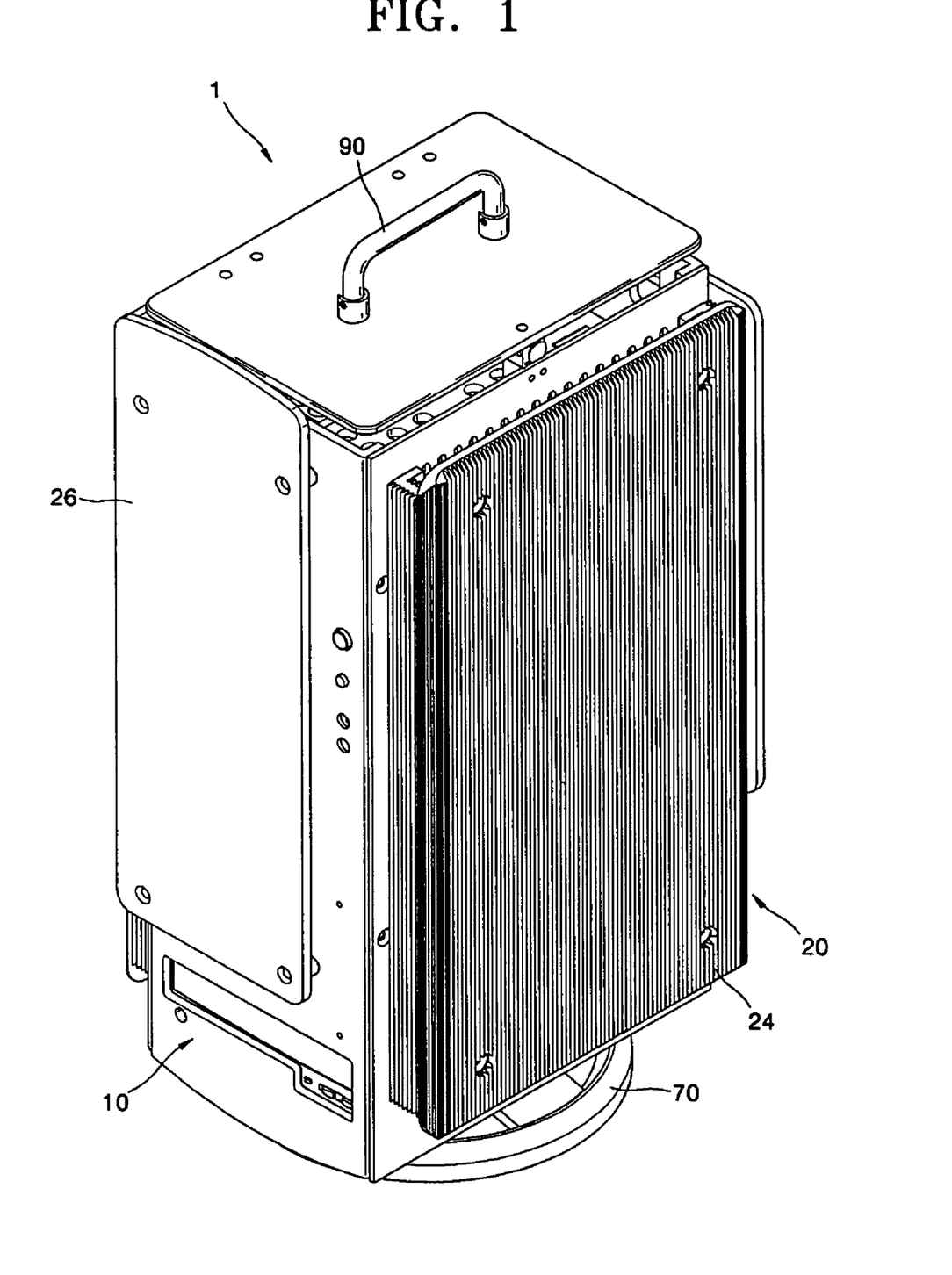
FIG. 1 is a perspective view of a computer according to an embodiment of the present invention.
Figure 2:
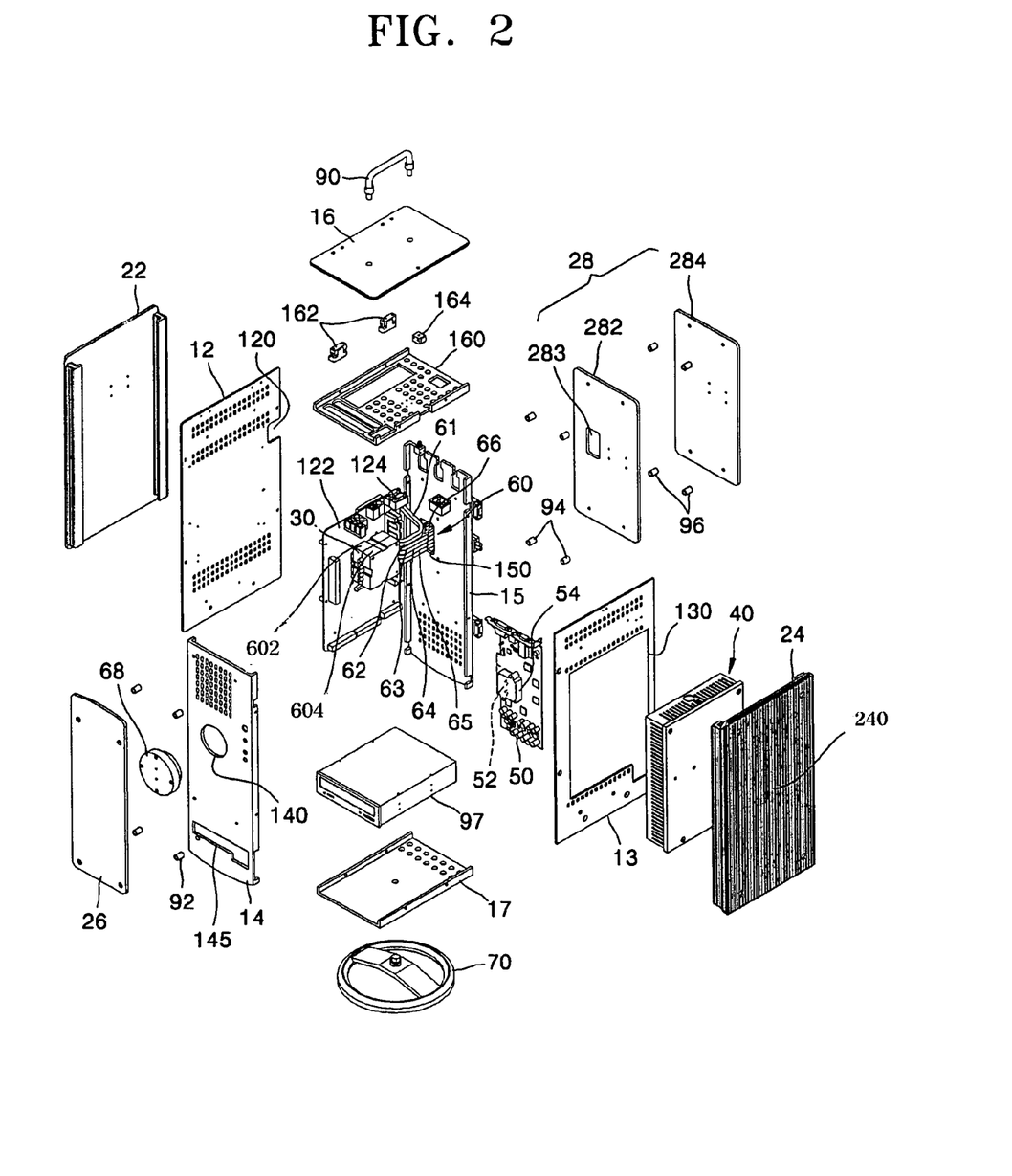
FIG. 2 is an exploded perspective view of the computer of FIG. 1.
Figure 3:
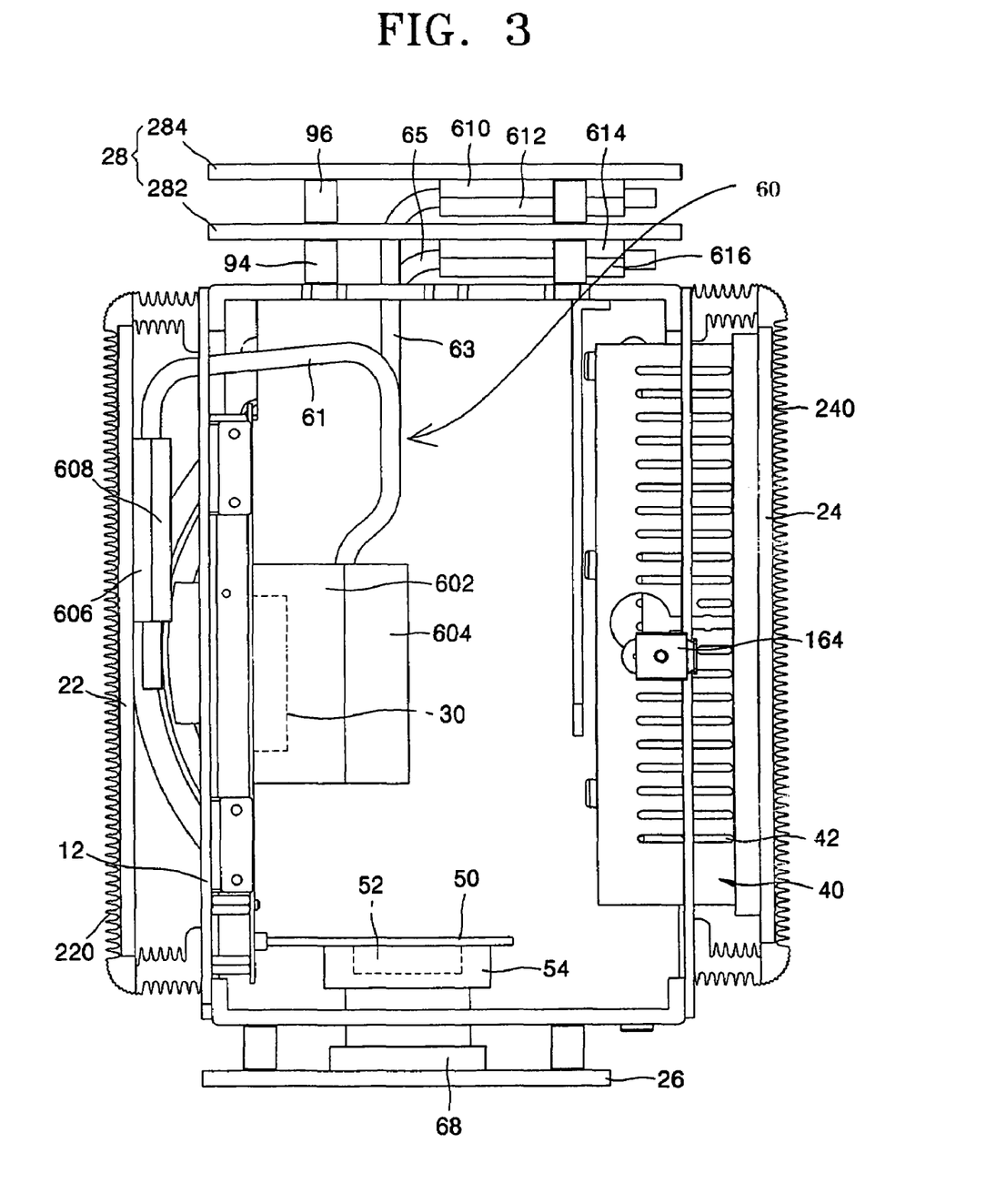
FIG. 3 is a top view of the computer of FIG. 1 from which an upper plate is removed.
Figure 4:
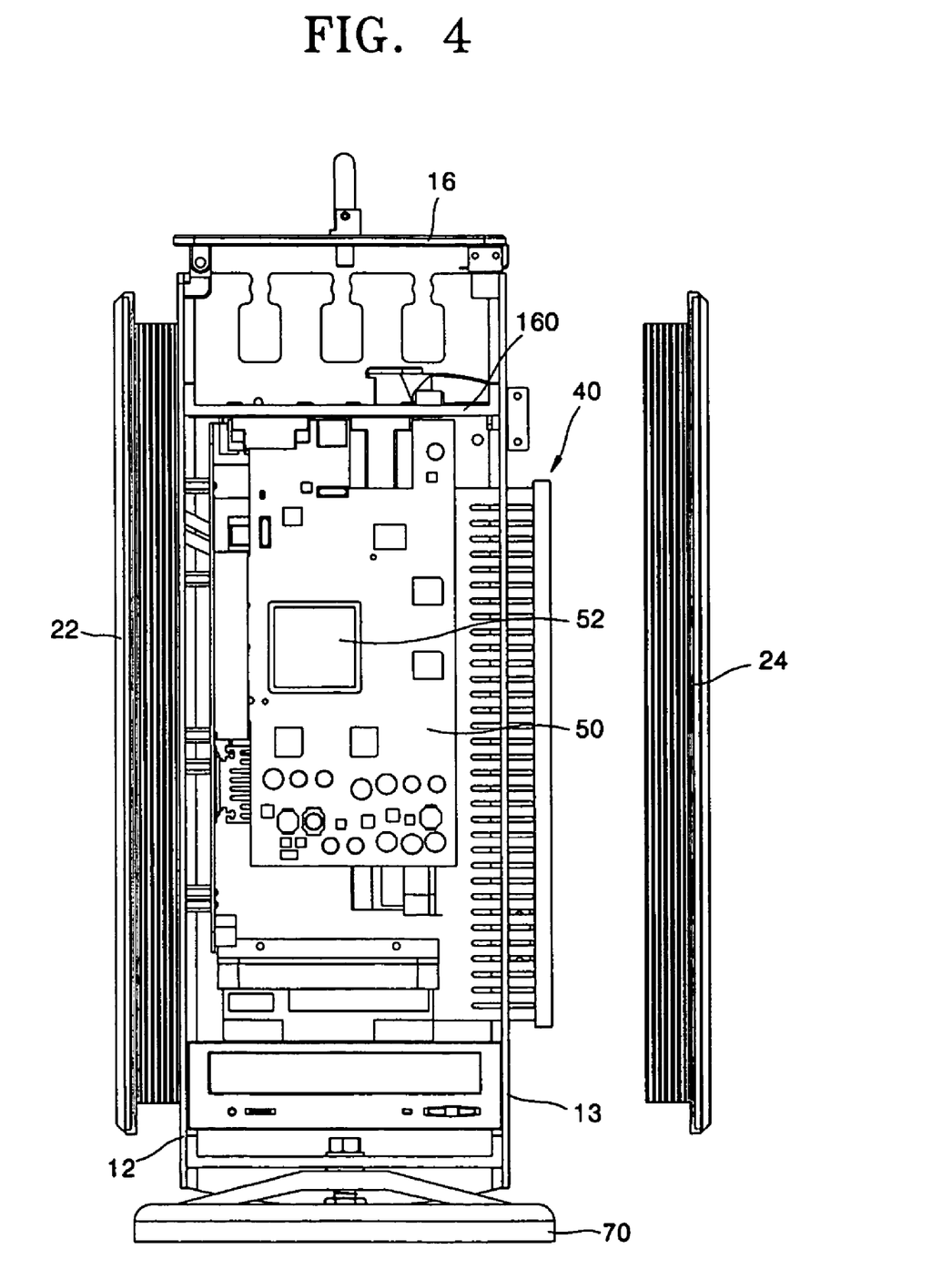
FIG. 4 is a front view of the computer of FIG. 1 from which a front plate is removed.

FIG. 1 is a perspective view of a computer according to an embodiment of the present invention. FIG. 2 is an exploded perspective view of the computer of FIG. 1. FIG. 3 is a top view of the computer of FIG. 1 from which an upper plate is removed.

A computer 1 includes a plurality of parts and a case 10 in which the parts are installed. Heat-dissipating plates 20 are disposed outside the case 10. Some of the parts generate heat when the computer 1 operates. In the present embodiment, the heat-generating components include a central processing unit (CPU) 30, a power supply 40, and a graphics card 50. Heat generated by the CPU 30, the power supply 40, and the graphics card 50 is transferred to the heat-dissipating plates 20 to be dissipated to the outside of the case 10.

The case 10 includes a plurality of plates. In the present embodiment, the case 10 has a hexahedral shape, and includes a left plate 12, a right plate 13, a front plate 14, a rear plate 15, an upper plate 16, and a lower plate 17.

The left plate 12 forms a left wall of the case 10. A through-hole 120 is formed in the left plate 12 to allow heatpipes 60 to pass through the through-hole 120. A plurality of ventilation holes are formed in the left plate 12 such that internal air having a temperature higher than external air can be discharged to the outside.

The right plate 13 forms a right wall of the case 10. A through-hole 130 which can accommodate the power supply 40 is formed in the right plate 13. A plurality of ventilation holes are formed in upper and lower portions of the right plate 13, similar to the left plate 12.

The front plate 14 forms a front wall of the case 10. A through-hole 140 into which a heat conduction unit 60 for the graphics card 50 can pass is formed in a central portion of the front plate 14. A plurality of ventilation holes are formed in an upper portion of the front plate 14. Also, another through-hole into which a digital versatile disk (DVD) drive or a compact disk (CD) drive can pass is formed in a lower portion of the front plate 14.

The rear plate 15 forms a rear wall of the case 10. A through-hole 150 through which the heatpipes 60 can pass is formed in the rear plate 15. A plurality of ventilation holes are formed in a lower portion of the rear plate 15.

The upper plate 16 forms a top surface of the case 10, and is pivotably coupled to other plates by a pair of hinges 162. A side of the upper plate 16 is fixed to the other plates by a fixing unit 164 using a magnetic force. Accordingly, when a force greater than the magnetic force is applied to the side of the upper plate 16, the upper plate 16 is forced to pivot around the hinges 162 to open the case 10. A support plate 160 is provided under the upper plate 16. A handle 90 is disposed on the upper plate 16 so that the case 10 can be easily carried.

The support plate 160 fixedly supports the various parts installed in the case 10. Also, connectors are fixed to the support plate 160 to connect various external devices to the internal parts. For example, connectors 124 are disposed on a main board 122, the graphics card 50 (not shown), and so on. In order to connect electric lines or various cables, e.g., monitor cables or printer cables, to the support plate 160, the upper plate 16 is opened, a desired process is performed, and then the upper plate 16 is closed. Here, the upper plate 16 is fixed to other plates by the fixing unit 164.

The lower plate 17 forms a bottom surface of the case 10. A leg member 70 is disposed under the bottom surface 17 such that the lower plate 17 of the case 10 is separated from the floor by a distance equivalent to the height of the leg member 70. Accordingly, there is a space formed under the lower plate 17 and thus air can be smoothly circulated upward.

The heat-dissipating plates 20 are separated from the case 10 by a predetermined distance from the case 10 to face the case 10. In the present embodiment, the heat-dissipating plates 20 include heat-dissipating plates 22, 24, 26, and 28 respectively disposed on and parallel to the left plate 12, the right plate 13, the front plate 14, and the rear plate 15.

The heat-dissipating plate 22 disposed on the left plate 12 is made of aluminium having a high thermal conductivity using extrusion. A plurality of vertical heat-dissipating fins 220 (shown in FIG. 3) protrude in a vertical direction from an outer surface of the heat-dissipating plate 22 to increase the surface area of the heat-dissipating plate 22 and efficiently dissipate heat. The heat-dissipating fins 220 may or may not be formed depending on the amount of heat to be dissipated.

The heat-dissipating plate 24 disposed on the right plate 13 is made of aluminium and has a plurality of heat-dissipating fins 240 (shown in FIG. 2 and 3) protruding from an outer surface thereof, similar to the heat-dissipating plate 22.

The heat-dissipating plate 26 disposed on the front plate 14 is made of aluminium having a high thermal conductivity and has a flat shape. The heat-dissipating plate 26 is separated] from the front plate 14 by four separating members 92. Here, a through-hole 145 into which a drive 97, such as a compact disk-read only memory (CD-ROM) drive or a digital versatile disk-read only memory (DVD-ROM) drive, can be inserted is formed in the front plate 14.

The heat-dissipating plate 28 disposed on the rear plate 15 includes a first heat-dissipating plate member 282 and a second heat-dissipating plate member 284 that are separated from each other and parallel to each other. The first and second heat-dissipating plate members 282 and 284 are made of aluminium and have a flat shape. The first heat-dissipating plate member 282 is separated from the rear plate 15 by separating members 94, and the second heat-dissipating plate member 284 is separated from the first heat-dissipating plate member 282 by separating members 96. The number of heat-dissipating plate members can be changed according to the amount of heat to be dissipated. A through-hole 283 through which the heatpipes 60 can pass is formed in a substantially central portion of the first heat-dissipating plate member 282.

Referring to FIGS. 2 and 3, among the heat-generating components, the CPU 30 is mounted on the main board 122 that is separated from the left plate 12. The CPU 30 generates a great amount of heat during operation. Most of the heat generated by the CPU 30 is transferred to the heat-dissipating plates 22 and 28 through the heatpipe 60, and then outwardly discharged due to natural convection with external air.

The heatpipes 60 absorb and rapidly transfer heat from the CPU 30 to the heat-dissipating plates 20 having a lower temperature. Accordingly, the heatpipes 60 may also be called heat transfer pipes. Since the detailed structure of the heatpipes 60 for absorbing and transferring heat is well known in the art and is not a main feature of the present invention, a detailed explanation thereof will not be given. The heatpipes of the present embodiment are arranged in predetermined directions such that portions of the heatpipes contacting a higher temperature area are level with or lower than portions of the heatpipes contacting a lower temperature area.

In the present embodiment, six heatipies 60 are used, however, as few as three heatpipes can be used. The diameter of the heatpipes 60 is such that the heatpipes are flexible enough to be easily bent into desired shapes and can maintain their shapes after being bent. Each of the six heatpipes 60 has a diameter of 8 mm or less. In the present embodiment, the heatpipes have a diameter of 6 mm. When the heatpipes 60 have sufficient flexibility to remain unhardened in a bending process, the heatpipes 60 can endure impacts. Because multiple heatpipes are used, the functions of the heatpipes 60 are maintained even when some of the heatpipes 60 malfunction, and only the malfunctioning heatpipes need to be replaced.

For the heatpipes 61, 62, 63, 64, 65, and 66 to effectively transfer heat to the corresponding heat-dissipating plates 20, first and second ends of the heatpipes 60 are thermally connected to the CPU 30 and the heat-dissipating plates 20, respectively, through heat conducting blocks.

Referring to FIGS. 2 and 3, among the heat pipes 61, 62, 63, 64, 65, and 66, two heat pipes 61 and 62 (heat pipes 62 not shown in FIG. 3 because it is hidden under heat pipe 61) have first ends thermally connected to the CPU 30 by heat conducting blocks that include first and second members 602 and 604, to transfer heat generated by the CPU 30. The first and second members 602 and 604 are made of a material having a high thermal conductivity, such as aluminium or copper.

The first member 602 is tightly connected to the CPU 30 to effectively absorb heat generated by the CPU 30. The second member 604 is tightly connected to the first member 602. Six semi-cylindrical grooves are respectively formed in contact surfaces between the first and second members 602 and 604. When the first and second members 602 and 604 contact each other, the six grooves of the first member 602 match with the six grooves of the second member 604 to form six heat pipe holes in which the first ends of the heat pipes 60 can be accommodated. The outer circumferential surfaces of the first ends of the first and second heat pipes 61 and 62 closely contact the inner circumferential surfaces of the two upper heat pipe holes among the six heat pipe holes.

The second ends of the two heatpipes 61 and 62 are connected to an inner surface of the heat-dissipating plate 22 by heat conducting blocks that include first and second members 606 and 608, to transfer heat received from the CPU 30 to the heat-dissipating plate 22. Here, the first and second heatpipes 61 and 62 are appropriately bent to be connected to the heat-dissipating plate 22 through the through-hole 120 formed in the left plate 12 without contacting the left plate 12.

The first member 606 is tightly connected to the inner surface of the heat-dissipating plate 22. The second member 608 is tightly connected to the first member 606 to form two heatpipe holes. Outer circumferential surfaces of the second ends of the first and second heatpipes 61 and 62 closely contact the inner circumferential surfaces of the heatpipe holes formed between the first and second members 606 and 608.

The first ends of the two heat pipes 63 and 64 (heat pipes 64 not shown in FIG. 3 because it is hidden under heat pipes 63) among the six heat pipes are thermally connected to the CPU 30 in the same manner as the heat pipes 61 and 62. The heat pipes 63 and 64 are appropriately bent to pass through the through-hole 150 formed in the rear plate 15 without contacting the rear plate 15 and then pass through the through-hole 283 formed in the first heat-dissipating plate member 282. The second ends of the heat pipes 63 and 64 are thermally connected to an inner surface of the second heat-dissipating plate member 284 by heat conducting blocks that include first and second members 610 and 612. The structures of the first and second members 610 and 612 and the method of coupling the second ends of the heatpipes 63 and 64 to the first and second members 610 and 612 are the same as described with reference to the first and second members 606 and 608.

The first ends of the two heat pipes 65 and 66 (heat pipes 66 not shown in FIG. 3 because it is hidden under heat pipes 65) among the six heat pipes are thermally connected to the CPU 30 in the same manner as the heat pipes 63 and 64. The heat pipes 65 and 66 are appropriately bent to pass the through-hole 150 formed in the rear plate 15 without contacting the rear plate 15. The second ends of the heat pipes 65 and 66 are thermally connected to an inner surface of the first heat dissipating member 282 by heat conducting blocks that include first and second members 614 and 616. The structures of the first and second members 614 and 616 and the method of coupling the second ends of the heat pipes 65 and 66 to the first and second members 614 and 616 are the same as described with reference to the first and second members 606 and 608.

Referring to FIGS. 2 through 5, among the heat-generating components, the power supply 40 is partially exposed to the outside of the case 10 through the large through-hole 130 formed in the right plate 13. Half of the power supply 40 remains inside the case 10 and the rest of the power supply 40 extends beyond the case 10, such that a surface of the power supply 40 disposed outside the case 10 contacts an inner surface of the right heat-dissipating plate 24. Most of heat generated by the power supply 40 is directly transferred to the heat-dissipating plate 24 to be outwardly discharged due to natural convection with external air.

Figure 5:
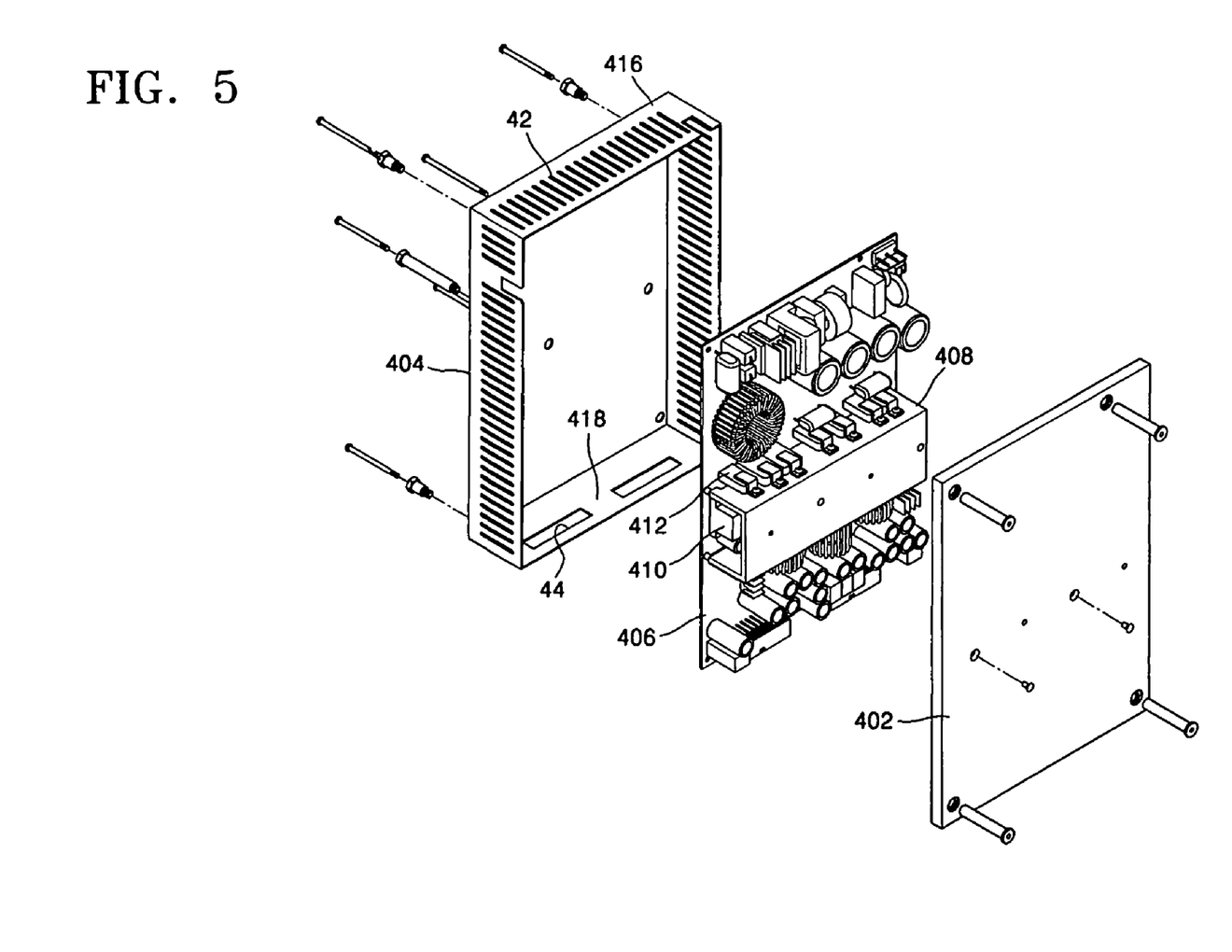
FIG. 5 is an exploded perspective view of a power supply of the computer of FIG. 2.

FIG. 5 is an exploded perspective view of the power supply 40. Referring to FIG. 5, the power supply 40 includes an upper plate member 402 and a lower plate member 404 each of which has a hexahedral shape. Various electric devices are mounted on a circuit board 406 inside the power supply 40. Some of the electric devices that generate a larger amount of heat, such as, transformers 410 and power transistors 412, are thermally connected to a heatsink 408. The heatsink 408 is made of a material having high thermal conductivity just as aluminium. The heatsink 408 is tightly fixed to one surface of the upper plate member 402, and the other surface of the upper plate member 402 is tightly fixed to the inner surface of the heat-dissipating plate 24. Here, the heatsink 408 and the upper plate member 402 are tightly fixed to the heat-dissipating plate 24 using coupling holes formed in the upper plate member 402 and the heatsink 408.

Accordingly, when the power supply 40 operates and the transformers 410 and the power transistors 412 generate heat, most of the generated heat is transferred to the heatsink 408, then transferred to the heat-dissipating plate 24 via the upper plate member 402, and then outwardly discharged due to natural convection with external air around the heat-dissipating plate 24.

A plurality of slit-shaped through-holes 42 are formed in an upper surface 416 of the lower plate member 404 of the power supply 40, and two through-holes 44 are formed in a lower surface 418 of the lower plate member 404 of the power supply 40. The power supply 40 having the through-holes 42 and 44 is partially disposed outside the case 10, such that external air enters the power supply 40 through the through-holes 44 formed in the lower surface 418 to remove some of the heat generated by the heat-generating devices installed inside the power supply 40, and then outwardly discharged through the through-holes 42 formed in the upper surface 416. The shapes of the through-holes 42 and 44 are not limited to the shapes in the present embodiment, and the through-holes 42 and 44 may have various other shapes.

Although the through-holes 42 formed in the upper surface 416 are formed both inside and outside the case 10 in FIG. 3, when the upper plate 16 of the case 10 is closed, in order to prevent warm air in the power supply 40 from propagating into the case 10, the portions of the through-holes 42 formed inside the case 10 may be closed so that only the portions of the through-holes 42 exposed to the outside of the case 10 are used. In the present embodiment, a plurality of slit-shaped through-holes is also formed in side surfaces of the power supply 40. In this case, portions of the plurality of through-holes formed inside the case 10 may be closed.

Among the heat-generating components, the graphics card 50 is inserted into a slot of the main board 122 that is separated from the left plate 12. Among various electric devices mounted on the graphics card 50, a chipset 52 generates a greater amount of heat during operation than other electric devices. Most of the generated heat is transferred to the heat-dissipating plate 26 via a heat conduction unit 68, and then outwardly discharged due to natural convection with external air.

The heat conduction unit 68 may directly contact the chipset 52 mounted on the graphics card 50, but in the present embodiment, a heatsink 54 is tightly fixed to the chipset 52 and the heatsink 54 contacts the heat conduction unit 68. The heat conduction unit 68 is made of a material having a high thermal conductivity, such as aluminium. A first end of the heat conduction unit 68 is thermally connected to the chipset 52 via the heatsink 54, and a second end of the heat conduction unit 68 is thermally connected to the heat-dissipating plate 26 disposed on the front plate 14. Since the heat conduction unit 68 passes through the through-hole 140 formed in the front plate 14 without contacting the front plate 14, the heat conduction unit 68 does not transfer heat to the front plate 14.

The computer 1 of the present embodiment transfers heat generated during the operation of the CPU 30, the power supply 40, and the graphics card 50 to the heat-dissipating plates 20 disposed outside the case 10, and then discharges the heat to the outside of the case 10. Since heat generated by the heat-generating components is not transferred to the inside of the case 10, the internal temperature of the case 10 does not rise to a serious level, and heat transferred to the heat-dissipating plates 20 can be cooled using external air, the temperature of which is lower than the temperature of internal air by 7 to 8 degrees on average.

Also, since the computer 1 does not employ a plurality of cooling fans that are used by conventional computers to cool heat-generating components, mechanical noise generated by cooling fans is not generated during the operation of the computer 1.

Since the heatpipes 60 having a high thermal conductivity transfer heat generated by the CPU 30 to the heat-dissipating plate 22 having the heat-dissipating fins 220 and the heat-dissipating plate 28 including the first and second heat-dissipating plate members 282 and 284, heat can be transferred rapidly.

Since the electric devices that generate a great amount of heat among the electric devices installed inside the power supply 40 thermally contact the heatsink 408 made of aluminium and the heatsink 408 contacts the inner surface of the right heat-dissipating plate 24 through the upper plate member 402, most of the heat generated by the power supply 40 can be transferred to the heat-dissipating plate 24 having the heat-dissipating fins 240 and discharged outwardly. Accordingly, the internal temperature of the case 10 is prevented from rising due to the heat generated by the power supply 40. Additionally, since the through-holes 42 and 44 are formed in the upper surface 416 and the lower surface 418 of the power supply 40, external air can enter the power supply 40 to partially absorb internal heat and warm air can be discharged to the outside of the case 10.

In the computer 1 of the present embodiment, since the upper plate 16 is designed to open and close the case 10 and various connectors are disposed under the upper plate 16, various cables can be more easily connected than those of a conventional computer in which connectors are disposed in the rear of the computer.

Although the heat-dissipating plates 20 are made of aluminium, the left and right heat-dissipating plates 22 and 24 have the heat-dissipating fins formed thereon, and the rear heat-dissipating plate 28 includes the plurality of parallel heat-dissipating plate members, the present invention is not limited thereto. The heat-dissipating plates may be made of other material having a high thermal conductivity, such as copper, and the shapes of the heat-dissipating plates may be varied to effectively dissipate heat.

Although the heatpipes are arranged in predetermined directions, the illustrated directions are examples only and heatpipes arranged in other directions can be used. In this case, portions of the heatpipes contacting a higher temperature area do not need to be lower than portions of the heatpipes contacting a lower temperature area.

Although the CPU 30, the power supply 40, and the graphics card 50 are exemplified as the heat-generating components, the present invention is not limited thereto, and heat generated by the graphics card 50 may be cooled in other ways if required.

Although the heatsink 408 is installed inside the power supply 40 to transfer heat generated by the power supply 40 to the heat-dissipating plate 24, the present invention is not limited to this configuration. That is, heat generated by the power supply 40 can be transferred to the heat-dissipating plates 20 in other ways.

Figure 6:
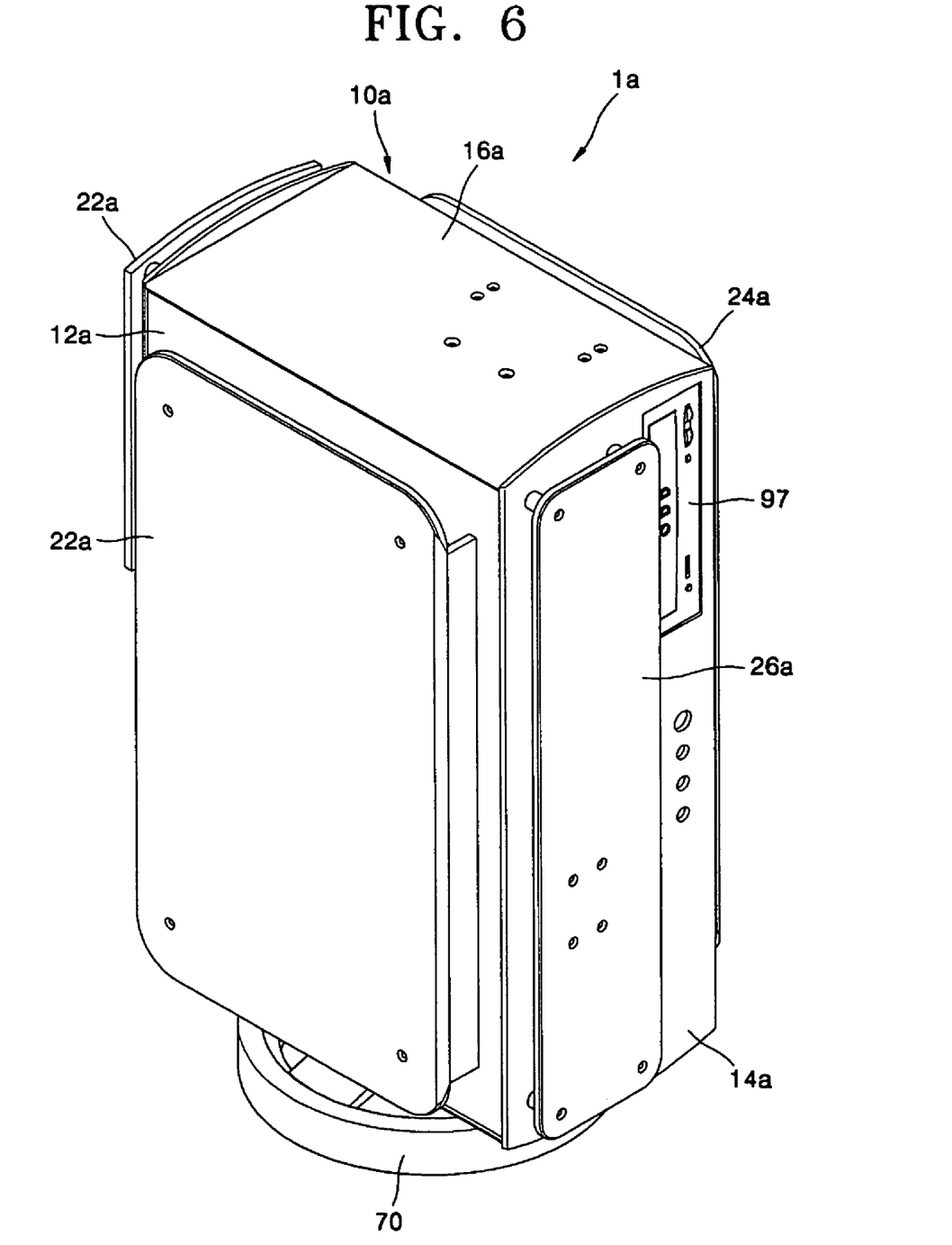
FIG. 6 is a perspective view of a computer according to another embodiment of the present invention.
Figure 7:
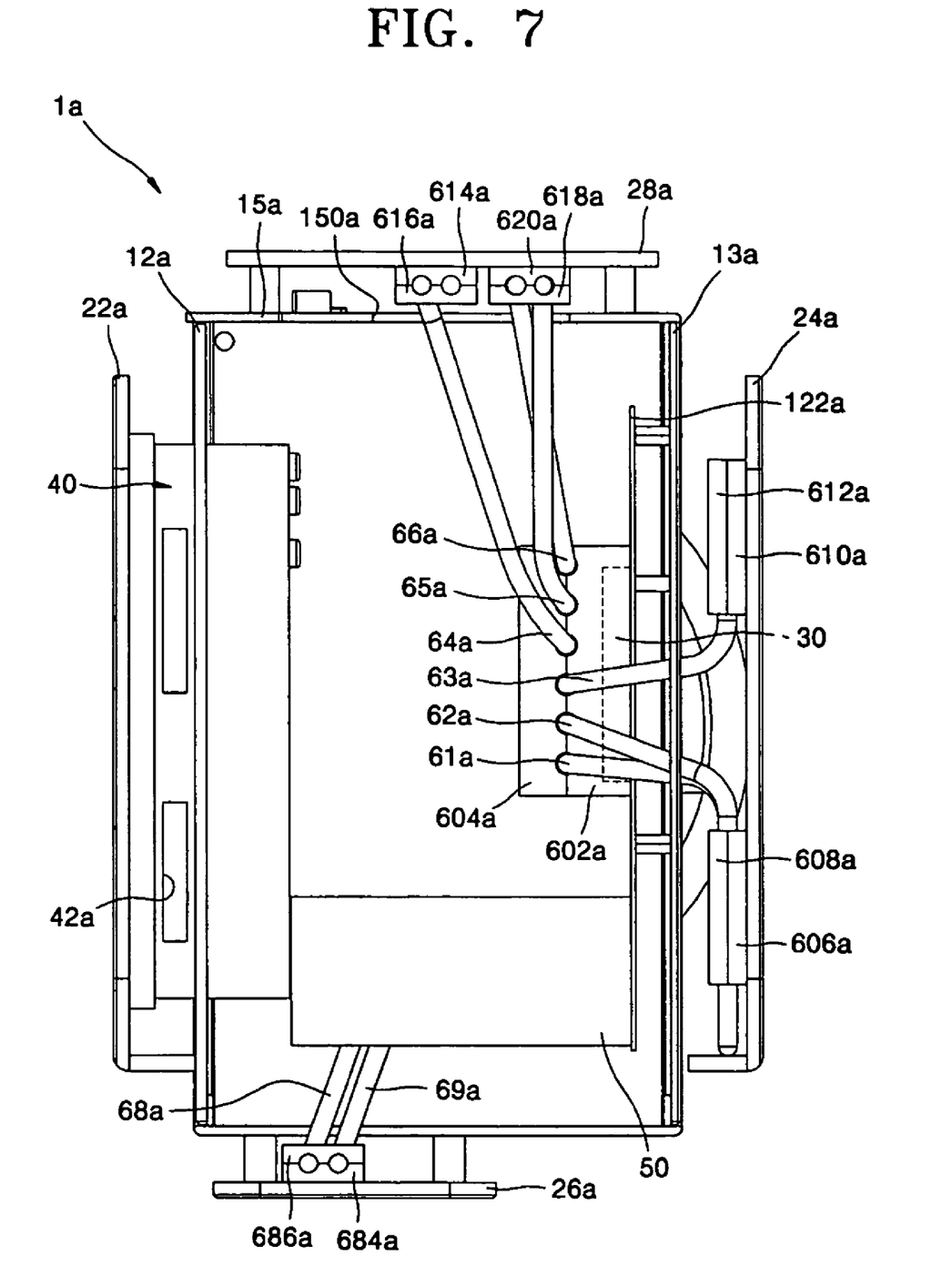
FIG. 7 is a top view of the computer of FIG. 6 from which an upper plate is removed.
Figure 8:
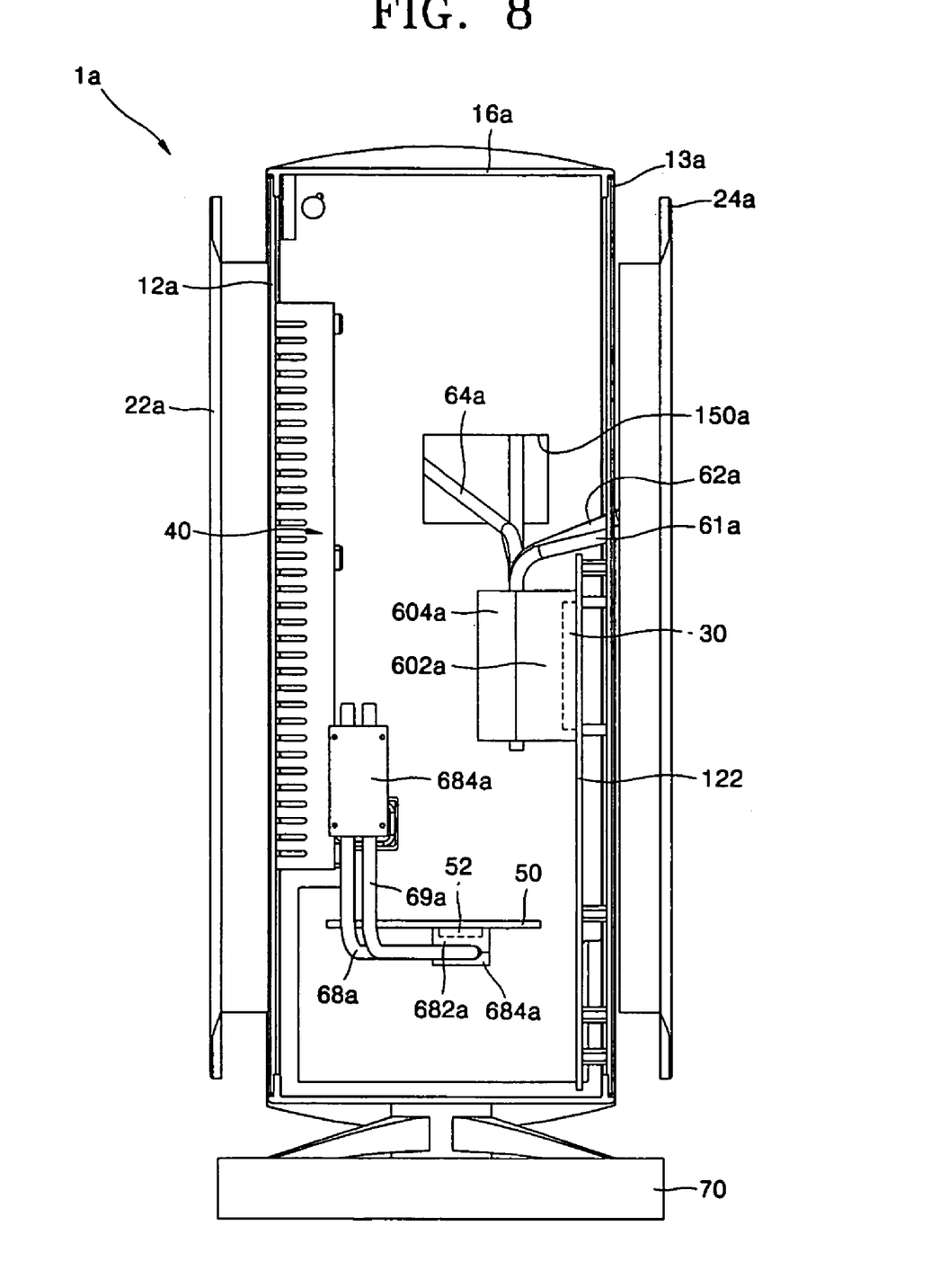
FIG. 8 is a front view of the computer of FIG. 6 from which a front plate is removed.
Figure 9:
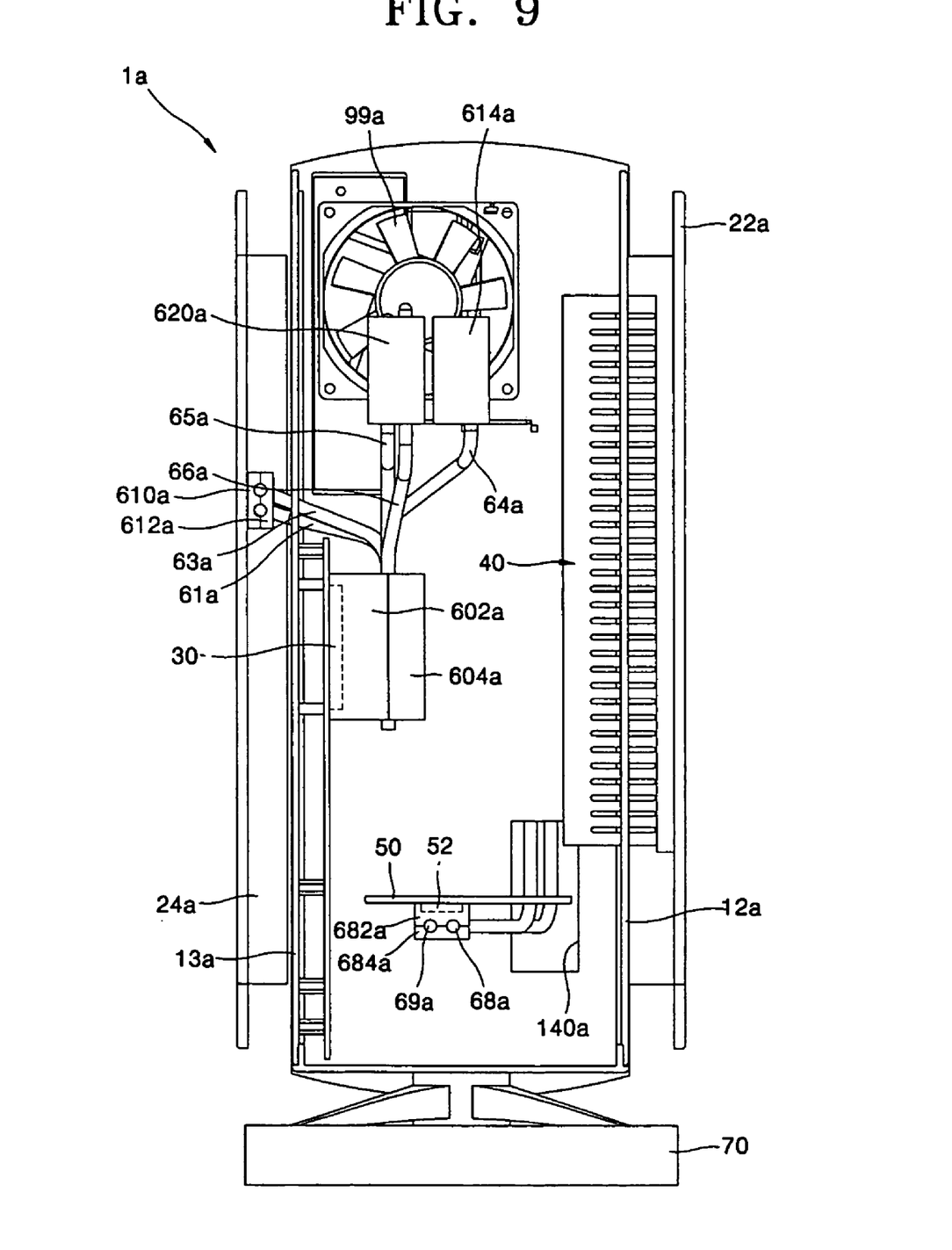
FIG. 9 is a rear view of the computer of claim 6 from which a rear plate is removed.

FIG. 6 is a perspective view of a computer 1a according to another embodiment of the present invention. FIG. 7 is a top view of the computer 1a of FIG. 6 from which an upper plate is removed. FIG. 8 is a front view of the computer 1a of FIG. 6 from which a front plate is removed. FIG. 9 is a rear view of the computer 1a of FIG. 6 from which a rear plate is removed.

When a comparison is made between the computer 1 illustrated in FIGS. 1 through 5 and the computer 1a illustrated in FIGS. 6 through 9, they are slightly different in the arrangements of the parts in the case 10, 10a and the method of transferring heat generated by the parts to the heat-dissipating plates 20, 20a. However, the computers 1 and 1a share a common feature in that heat generated by the parts installed in the case 10a is outwardly conducted to the heat-dissipating plates 20a disposed outside the case 10a without using cooling fans.

The computer 1a will now be explained focusing on differences between it and the computer 1. For parts of the computer 1a that are not described here, the above descriptions of parts that correspond to those in the computer 1a can be referred to. Elements of the computer 1a that function in the same way as in the computer 1 are denoted by the same reference numerals.

In the computer 1a, a main board 122 on which the CPU 30 is mounted is disposed on the right side, a power supply 40 is disposed on the left side, and the graphics card 50 is horizontally mounted on the main board 122. Left and right heat-dissipating plates 22a and 24a have no heat-dissipating fins, and a rear heat-dissipating plate 28a is formed as a single body. An upper plate 16a cannot be opened and closed, and various connectors for connecting internal parts to external devices are disposed at the rear.

Six heatpipes 60a transfer heat generated from the CPU 30 to the right heat-dissipating plate 24a and the rear heat-dissipating plate 28a. Among the six heatpipes 60a, three heatpipes 61a, 62a, and 63a have first ends thermally connected to the CPU 30 by heat conducting blocks including first and second members 602a and 604a to receive heat generated by the CPU 30, and second ends connected to the heat-dissipating plate 24a by heat conducting blocks including first and second members 606a and 608a and heat conducting blocks including first and second members 610a and 612a to transfer the heat received from the CPU 30 to the right heat-dissipating plate 24a. Here, the heatpipes 61a, 62a, and 63a are appropriately bent to be connected to the heat-dissipating plate 24a through through-holes formed in the right plate 13a without contacting the right plate 13a.

Among the six heatpipes 60a, the other three heatpipes 64a, 65a, and 66a have first ends thermally connected to the CPU 30, and second ends thermally connected to the inner surface of the heat-dissipating plate 28a by heat conducting blocks including first and second members 614a and 616a and heat conducting blocks including first and second members 618a and 620a. The heatpipes 64a, 65a, and 66a are appropriately bent to pass through a through-hole 150a formed in the rear plate 15a without contacting the rear plate 15a.

The power supply 40 illustrated in FIGS. 6 through 9 is substantially the same as the power supply 40 illustrated in FIGS. 1 through 5, except that the power supply 40 contacts the heat-dissipating plate 22a and through-holes 42a formed in the upper surface of the power supply 40 have different shapes from those of the power supply in the previous embodiment.

The graphics card 50 among the heat-generating components is horizontally mounted on the main board 122. The heat conduction unit for transferring heat generated by the chipset 52 of the graphics card 50 to the front heat-dissipating plate 26a includes heatpipes 68a and 69a, unlike in the previous embodiment.

The heatpipes 68a and 69a have first ends thermally connected to the chipset 52 by heat conducting blocks including first and second members 682a and 684a and second ends connected to the front heat-dissipating plate 26a by heat conducting blocks including first and second members 684a and 686a. The heatpipes 68a and 69a pass through the through-hole 140a formed in the front plate 14a without contacting the front plate 14a.

Referring to FIG. 9, a cooling fan 99a is disposed on an upper rear portion of the computer 1a. The cooling fan 99a is an auxiliary element that operates to reduce the internal temperature of the case 10a only when the computer 1a is used for a long time in worse conditions than normal conditions, for example, when the computer is over clocked or in the midsummer, and thus the internal temperature of the case 10a rises over a predetermined level.

As described above, the computer according to the present invention can outwardly dissipate heat generated by the heat-generating components installed in the case to the heat-dissipating plates disposed outside the case without using cooling fans and increase the internal temperature of the case in a noiseless and efficient manner.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A computer comprising:
a plurality of parts including heat-generating components that generate heat during operation;
a case in which the parts are installed; and
one or more heat-dissipating plates separated from the case by a predetermined distance and facing the case;
wherein the heat-generating components include a central processing unit and a power supply, and the central processing unit and the power supply are each thermally connected to the heat-dissipating plates so that heat generated by the central processing unit and the power supply can be dissipated to the outside of the case via the heat-dissipating plates;
wherein a portion of the power supply extends beyond the case to be exposed to the outside of the case and a surface of the exposed portion of the power supply contacts the heat-dissipating plates, such that the power supply is thermally connected to the heat-dissipating plates.

2. The computer of claim 1, further comprising heat pipes passing through the case, the heat pipes having first ends connected to the central processing unit and second ends connected to the heat-dissipating plates,
wherein the central processing unit is thermally connected to the heat-dissipating plates via the heat pipes.

3. The computer of claim 1, wherein the power supply has through-holes formed in an upper surface and a lower surface, such that external air can flow into the power supply through the through-hole formed in the lower surface of the power supply and then can be discharged through the through-hole formed in the upper surface of the power supply.

4. The computer of claim 1, wherein the heat-generating components include a graphics card, the computer further comprising a heat conduction unit passing through the case and having a first end connected to the graphics card and a second end connected to the heat-dissipating plates to discharge heat generated by the graphics card to the outside of the case via the heat-dissipating plates, wherein the graphics card is thermally connected to the heat-dissipating plates via the heat conduction unit.

5. The computer of claim 1, wherein each of the heat-dissipating plates is made of aluminum and has a plurality of heat-dissipating fins protruding therefrom.

6. The computer of claim 1, wherein the heat-dissipating plates include a plurality of parallel heat-dissipating plate members that are separated from one another.

7. The computer of claim 1, wherein the case includes a plurality of plates, wherein among the plates, an upper plate forming a top surface of the case is pivotally coupled to other plates to open and close the case.

8. The computer of claim 1, further comprising a leg member that enables a bottom surface of the case to be separated from the floor on which the case stands.

* * * * *